United States Patent [19]

Qureshi

[11] Patent Number: 4,631,735
[45] Date of Patent: Dec. 23, 1986

[54] CODED MODULATION SYSTEM WITH FEEDBACK

[75] Inventor: Shahid U. H. Qureshi, Natick, Mass.

[73] Assignee: Codex Corporation, Mansfield, Mass.

[21] Appl. No.: 687,205

[22] Filed: Dec. 28, 1984

[51] Int. Cl.[4] ............................................. H04B 1/10
[52] U.S. Cl. ........................................ 375/34; 375/14; 375/99; 371/43
[58] Field of Search ..................... 375/11, 12, 14, 27, 375/34, 39, 42, 67, 99, 101, 102; 332/9 R; 340/347 DD; 333/18, 28 R; 371/43, 44, 45

[56] References Cited

U.S. PATENT DOCUMENTS

| | | | |
|---|---|---|---|
| 4,077,021 | 2/1978 | Csajka et al. ........................... | 375/67 |
| 4,087,787 | 5/1978 | Acampora .............................. | 371/43 |
| 4,447,908 | 5/1984 | Chevillat et al. ....................... | 375/67 |
| 4,483,012 | 11/1984 | Wei ........................................ | 375/27 |
| 4,484,338 | 11/1984 | Clark et al. ............................. | 375/94 |
| 4,489,418 | 12/1984 | Mazo ...................................... | 375/27 |
| 4,500,994 | 2/1985 | McCallister et al. ................... | 371/43 |
| 4,520,490 | 5/1985 | Wei ........................................ | 375/39 |
| 4,534,040 | 8/1985 | Thapar ................................... | 375/59 |
| 4,536,878 | 8/1985 | Rattlingourd et al. ................ | 371/43 |
| 4,545,054 | 10/1985 | Davis ..................................... | 371/43 |

OTHER PUBLICATIONS

Ungerboeck, "Channel Coding with Multilevel/Phase Signals", IEEE Transactions on Information Theory, vol. IT-28, No. 1, Jan., 1982, pp. 55-67.
Forney, "The Viterbi Algorithm", Proceedings of the IEEE, vol. 61, No. 3, Mar., 1973, pp. 268-278.
Qureshi, "Adaptive Equalization", IEEE Communications Magazine, Mar., 1982, pp. 9-16.
Belfiore and Park, "Decision Feedback Equalization", Proceedings of the IEEE, vol. 67, No. 8, Aug. 1979, pp. 1143-1156.
Falconer, "Application of Passband Decision Feedback Equalization in Two-Dimensional Data Communication Systems", IEEE Transactions on Communications Oct. 1976, pp. 1159-1166.
Forney, "Maximum-Likelihood Sequence Estimation of Digital Sequences in the Presence of Intersymbol Interference", IEEE Transactions on Information Theory, vol. IT-18, No. 3, May, 1972, pp. 363-378.
Qureshi and Newhall, "An Adaptive Receiver for Data Transmission Over Time-Dispersive Channels", IEEE Transactions on Information Theory, vol. IT-19, No. 4, Jul. 1973, pp. 448-457.
Falconer and Magee, "Adaptive Channel Memory Truncation for Maximum Likelihood Sequence Estimation", Bell System Technical Journal, vol. 52, Nov., 1973, pp. 1541-1562.
Qureshi, "An Adaptive Decision-Feedback Receiver Using Maximum Likelihood Sequence Estimation," IEEE International Conference on Communications Record, 1973, pp. 1410-1416.
Lee and Hill, "A Maximum Likelihood Sequence Estimator with Decision-Feedback Equalization," IEEE Transactions on Communications, vol. COM-25, No. 9, Sep. 1977, pp. 971-979.

*Primary Examiner*—Robert L. Griffin
*Assistant Examiner*—Stephen Chin

[57] ABSTRACT

A receiver for use in deciding which signal points were sent from a transmitter based on corresponding noise affected signals received over a channel, the transmitter including an encoder which encodes a stream of information symbols into the signal points, the noise affected signals carrying information about a particular sequence of possible states occupied in a succession of time intervals by a finite state process. The receiver includes feedback circuitry for generating a plurality of different modified versions of each received signal, and a decoder for deciding which signal points were sent, given the received signals, based on estimating the particular sequence of states, and using at least two different modified versions.

15 Claims, 10 Drawing Figures

CODED MODULATION SYSTEM WITH FEEDBACK

BACKGROUND OF THE INVENTION

This invention relates to modulated carrier systems of the so called coded type in which digital symbols to be sent over a band limited channel are encoded as a sequence of discrete signal points selected from an available signal point alphabet, with dependencies being introduced between successive signal points in the sequence to increase immunity to noise and distortion.

In typical such coded systems, for example the systems described in Csajka et al., U.S. Pat. No. 3,877,768, and Ungerboeck, "Channel Coding with Multilevel/Phase Signals", IEEE Transactions on Information Theory, Vol. ITI-28, No. 1, January, 1982, information about the dependencies between successive signal elements is exploited at the receiver using a maximum likelihood sequence estimation decoding technique based on the Viterbi algorithm described in Forney, "The Viterbi Algorithm", Proceedings of the IEEE, 61(3):268 (March 1973), incorporated by reference. In such a technique, instead of decoding each received signal independently into the signal point most likely to have been sent (i.e., the signal point closest to the received signal in the sense of Euclidean distance) a sequence of received signals is decoded into the sequence of signal points most likely to have been sent (i.e., into the sequence of signal points closest to the sequence of received signals in the sense of the algebraic sum of Euclidean distances or vector Euclidean distance). In such coded systems, final decisions are delayed for a sufficient number of symbol intervals to assure to an acceptably high probability that the sequence of which signal points were sent will be correctly decided.

By contrast to coded systems, in uncoded systems each symbol is encoded into a signal point based only on the symbol to be encoded, with no dependencies between successive signal points. At the receiver, decoding proceeds one symbol at a time.

Receivers for uncoded systems typically include an equalizer to reduce the effects of intersymbol interference introduced by the channel, as described in Qureshi, "Adaptive Equalization", IEEE Communications Magazine, March, 1982, incorporated by reference. A so called linear equalizer for a quadrature amplitude modulation (QAM) system, for example, is typically a transversal filter which takes samples of a received signal, multiplies each sample by a complex coefficient, and adds the products to obtain an equalized received signal for use in deciding the most probable signal point to have been sent. For channels with severe amplitude distortion, such a linear transversal equalizer enhances noise and correlates the noise in successive intervals.

A decision feedback type equalizer (DFE) can be substituted for the linear equalizer to perform equalization with less noise enhancement. DFEs are described in the Qureshi article cited above, in C. A. Belfiore and J. H. Park, Jr., "Decision Feedback Equalization", Proceedings of the IEEE, August, 1979, and in D. D. Falconer, "Application of Passband Decision Feedback Equalization in Two Dimensional Data Communication Systems", IEEE Transactions on Communications, October, 1976, hereby incorporated by reference. Generally, a DFE multiplies previous decisions by feedback coefficients and sums the products to produce a value to be applied to the demodulated, equalized, undecoded received signal to correct for the anticipated channel intersymbol interference in the currently received signal.

Receivers for uncoded systems sometimes use modified DFEs (which may be called noise predictors) to predict and compensate for the error component in the received signal, as described in the Belfiore and Park article. The noise predictor output is a weighted sum of past error signals (each based on a comparison of a past received signal with the corresponding decision), where the weighting coefficients are selected to minimize the average power of the residual error signals after prediction by removing the correlation which exists between successive error signals before prediction. Unlike the conventional DFEs, in noise predictors the coefficients of the linear (or forward) equalizer are independent of the noise predictor (or feedback) coefficients. The forward equalizer coefficients can be updated to minimize the mean square error before prediction. FIG. 1 illustrates the use of a noise predictor having only a single predictor coefficient.

Other decision feedback techniques have been used to correct for other kinds of channel imposed distortion. For example, adaptive phase predictors correct for phase jitter using the history of actual phase errors reflected in the most recent decisions as an indication of phase distortion.

In using decision feedback techniques with uncoded systems, decisions of which signal points were sent are available without delay.

Use of the so called Viterbi algorithm as an optimum method of detecting a sequence of transmitted signals received over a noisy channel with a known pattern of intersymbol interference (ISI) is described in Forney, "Maximum Likelihood Sequence Estimation of Digital Sequences in the Presence of Intersymbol Interference," IEEE Transactions on Information Theory, Vol. IT-18, No. 3, May 1972. This application of the Viterbi algorithm is similar to detecting a sequence of signals transmitted by coded modulation in that in both cases dependencies between successive signal elements are introduced by a finite state machine. In coded modulation systems, the finite state machine is the encoder in the transmitter, whereas in uncoded systems with ISI, the ISI model of the channel (including transmit and receive filters) represents the finite state machine as explained in the Forney article.

The complexity of the Viterbi algorithm when applied to uncoded systems with ISI increases exponentially with the number of ISI terms in the channel model. Therefore, methods of equalizing the channel to a desired impulse response with a relatively few number of ISI terms have been proposed by Qureshi and Newhall, "An Adaptive Receiver for Data Transmission over Time Dispersive Channels," IEEE Transactions on Information Theory, Vol. IT-19, No. 4, July 1973, and by Falconer and Magee, "Adaptive Channel Memory Truncation for Maximum Likelihood Sequence Estimation," Bell System Technical Journal, Vol. 52, November 1973. Both of these articles suggested using a linear transversal equalizer to equalize the channel to a few desired ISI terms prior to detection by the Viterbi algorithm.

When the amplitude spectrum of the original channel response and the desired truncated response are not similar in shape, equalization to the desired truncated response can be performed with less noise enhancement by using a DFE. Such a system suffers, however, from the same difficulty incurred in a coded system because the final decisions from the Viterbi algorithm are available for feedback only after a delay of more than a dozen symbol intervals.

Two schemes for using a DFE in conjunction with the Viterbi algorithm have been described in Qureshi, "An Adaptive Decision Feedback Receiver Using Maximum Likelihood Sequence Estimation," IEEE International Conference on Communications Record, 1973, and in Lee and Hill, "A Maximum Likelihood Sequence Estimator with Decision Feedback Equalization," IEEE Transactions on Communications, Vol. COM-25, No. 9, September 1977.

In the Qureshi scheme, the feedback information is tapped from the most likely path history of the VA (Viterbi algorithm) after some delay. The greater this delay is, the smaller the additional performance advantage of the DFE compared to a linear equalizer. However, the smaller the delay, the higher the probability of error in the tentative decisions being fed back which in turn leads to error propagation. Lee and Hill use an ordinary DFE with a memoryless threshold detector to obtain preliminary decisions. After a delay corresponding to the number of ISI terms in the desired truncated response, these decisions are used in the DFE which truncates the channel response to the desired length for the VA. Both the Qureshi and the Lee and Hill schemes exhibit error propagation in the DFE due to feedback of preliminary decisions with a probability of error higher than the final delayed decisions. In each case, a single equalized signal is used as input to the VA.

SUMMARY OF THE INVENTION

In general, the invention features generating a plurality of different modified versions of the noise affected signals received over a channel, and deciding which signal points were sent based on estimating the particular sequence of states occupied by a finite state process, by using at least two different modified versions of each received signal.

In preferred embodiments, the estimate of the particular sequence of states is based on the most likely possible surviving sequences of prior states ending in different ones of the possible states in a first time interval, and based on extending the surviving sequence for each state in the first time interval to the possible states in a next time interval by means of calculations with respect to state transitions leading to each of the possible states in the next time interval, at least one of the state transition calculations is based on one of the modified versions, and at least a second one of the state transition calculations on a different one of the modified versions; there are a plurality of different feedback signals, and the feedback circuitry generates the different modified versions of the received signals based respectively on different feedback signals; the decoder generates final decisions about which signal point was sent after a plurality of the time intervals have passed, and generates alternative preliminary decisions about which signal point was sent after fewer time intervals have passed, different feedback signals being based on alternative preliminary decisions; and the alternative preliminary decisions are respectively based on different ones of the modified versions of the received signals.

In other preferred embodiments, the feedback circuitry generates different modified versions corresponding to different surviving sequences ending in different ones of the possible states; the feedback circuitry includes a plurality of decision feedback equalizers of the noise predictor type, each of which generates one of the modified versions by offsetting the received signal by a noise prediction value; the feedback circuitry generates the noise prediction values based on errors between modified versions of prior received signals and preliminary decisions; and there are two possible states in each time interval, and two modified versions of each said received signal, each modified version being associated with one surviving sequence.

In other preferred embodiments, the state transition calculations are made by finding the distance between each modified version and the nearest signal point associated with each of the state transitions in the surviving sequences leading to a state corresponding to the modified version, and the decoder returns to the feedback circuitry, feedback signals comprising the errors between each modified version in a sequence of modified versions and the nearest signal points associated with each said surviving sequence state transitions leading to the state corresponding to the modified version; the noise predictor includes a limiter for limiting the weight of the errors on currently used noise prediction values; the signal point is sent over the channel in each time interval; the finite state process is a finite state device in the transmitter whose state is based on the information symbols; and the signal points are transmitted via a modulated carrier.

The invention provides the advantages of feedback techniques to improve noise immunity in systems which delay the final receiver decisions. Error propagation which would result if error prone tentative decisions were used in a single feedback device is avoided. The correlation which exists between successive error signals before prediction can be removed. Since the best preliminary decisions in each surviving path are used to predict and compensate for noise at each interval, the trellis path which is ultimately selected as the most likely will always have been derived using those best preliminary decisions. For channel characteristics with attenuation distortion, a signal to noise ratio advantage of 0.5 to 1.5 dB can be obtained by using a noise predictor with even a single coefficient, the actual advantage depending on the channel characteristics and the coding system employed.

Other advantages and features of the invention will be apparent from the following description of the preferred embodiment, and from the claims.

DESCRIPTION OF THE PREFERRED EMBODIMENT

We first briefly describe the drawings.

DRAWINGS

Figure 7:
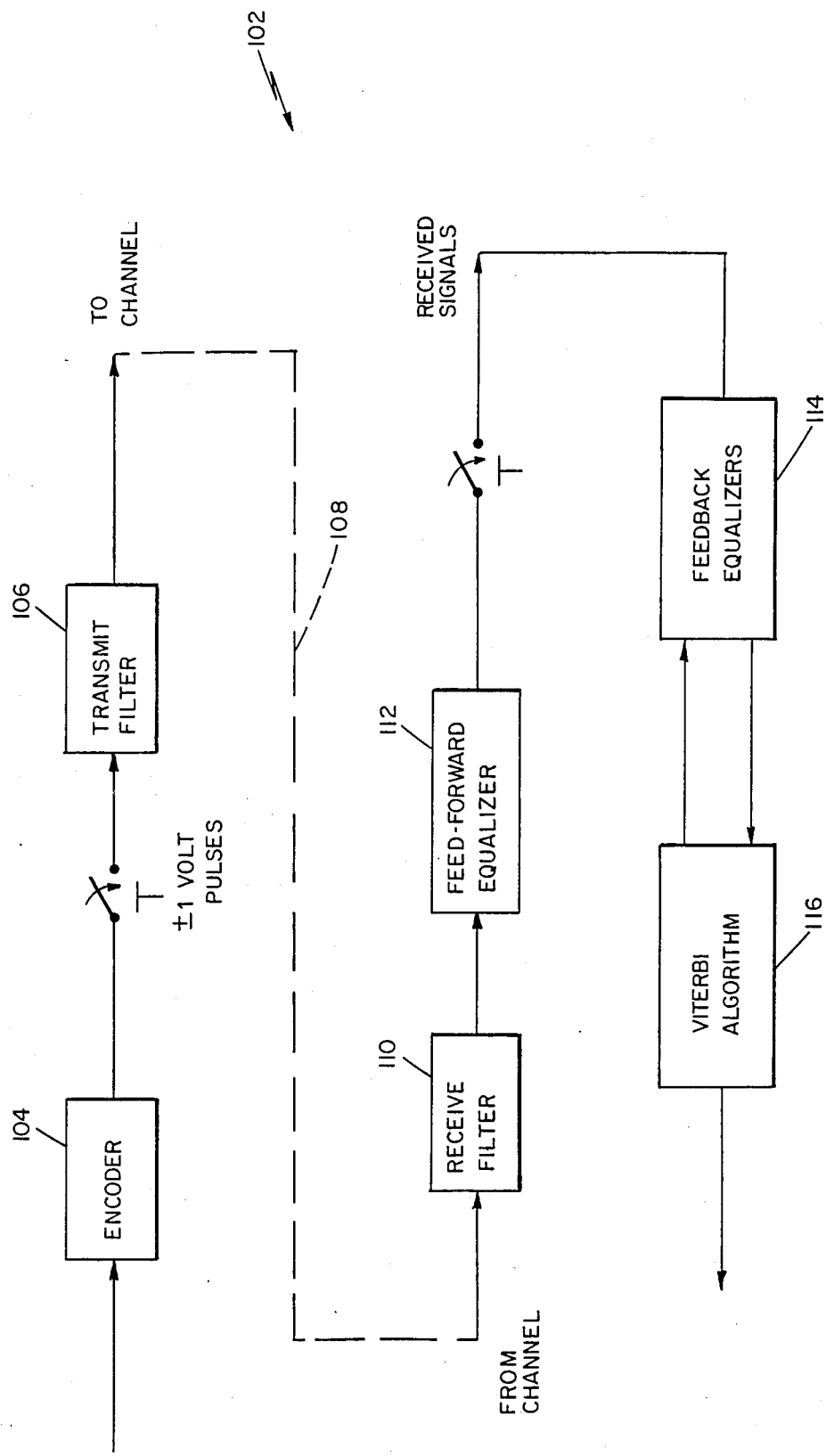
FIG. 7 is a block diagram of an alternate embodiment in a baseband system.
Figure 8:
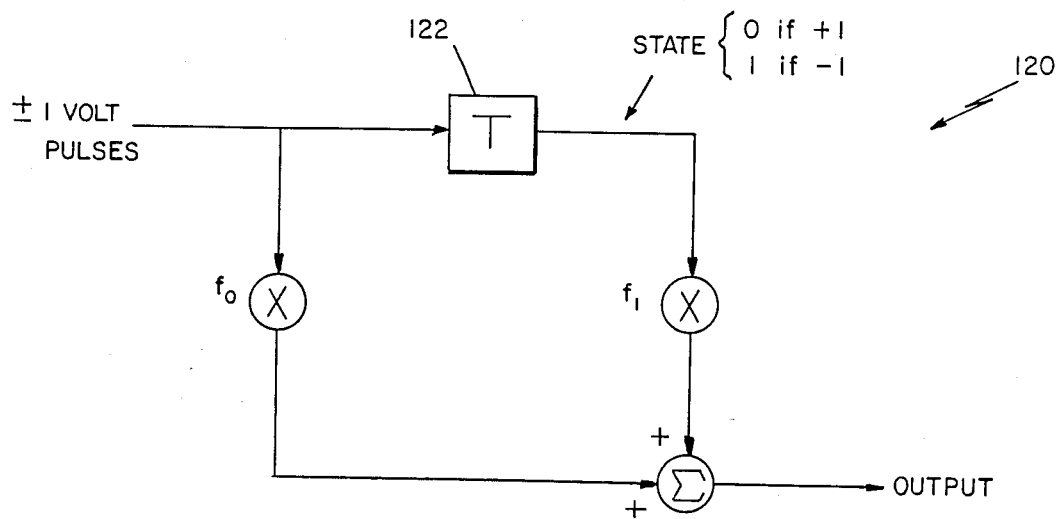
Figure 9:
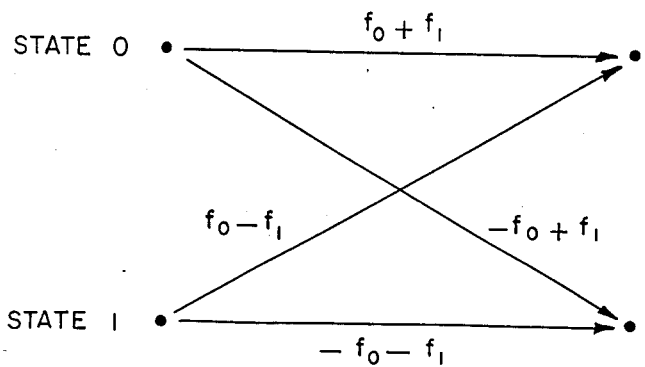
Figure 10:
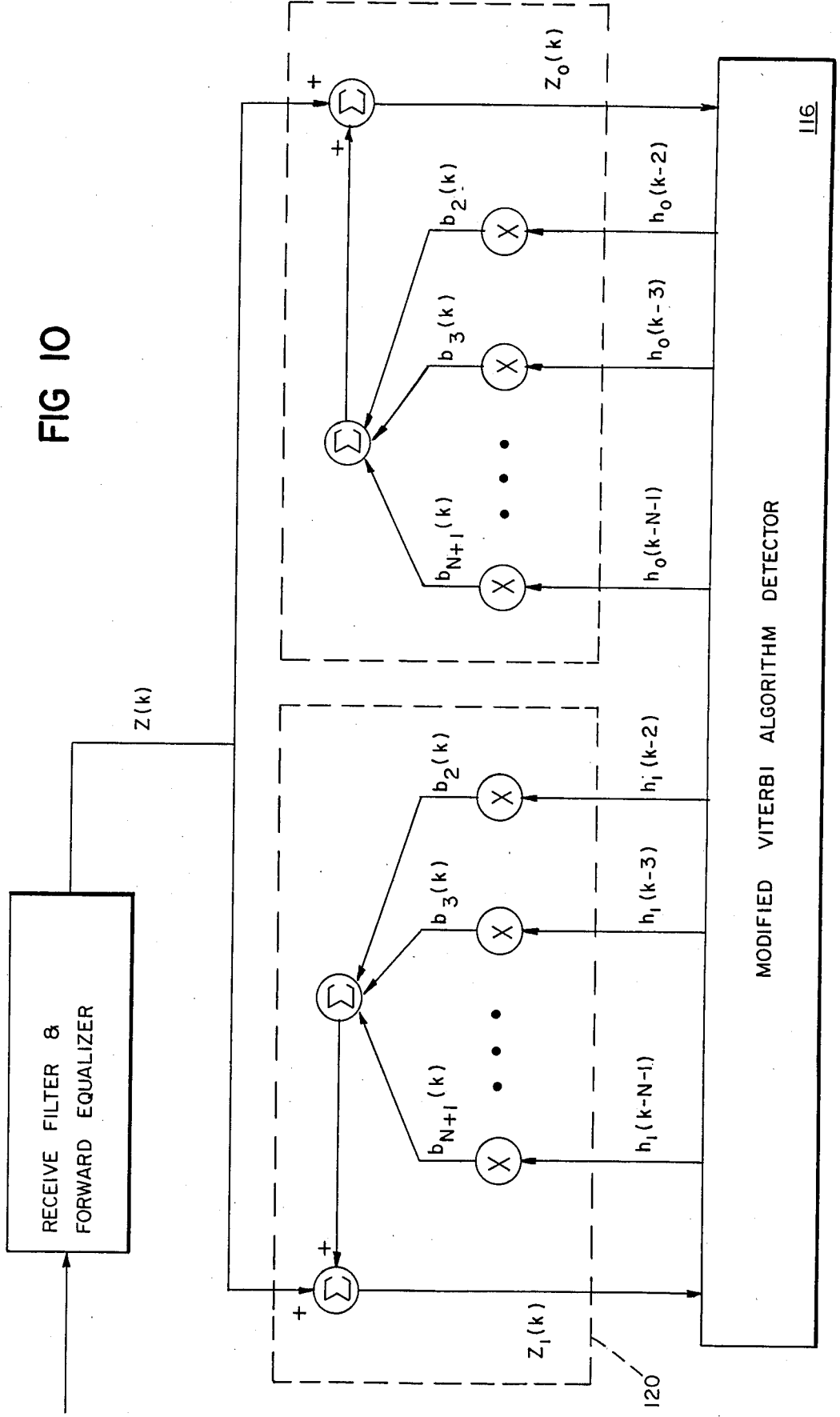

FIG. 8 is a block diagram of a channel model.
FIG. 9 is a trellis diagram corresponding to FIG. 8.
FIG. 10 is a block diagram of the embodiment of FIG. 7 with two feedback equalizers.

STRUCTURE AND OPERATION

Figure 1:
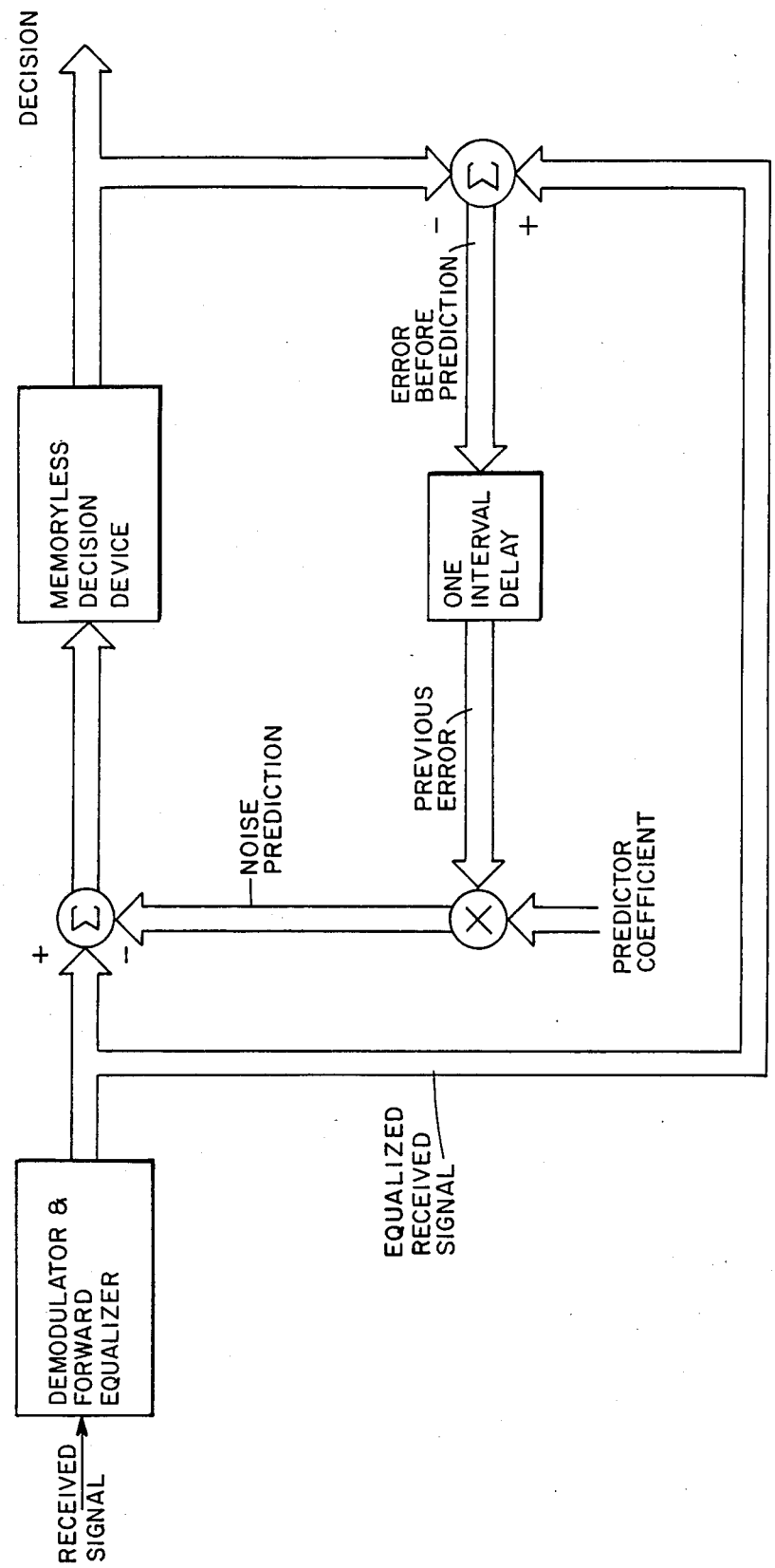
FIG. 1 is a block diagram of a receiver for use with an uncoded system and including a prior art noise predictor.
Figure 2:
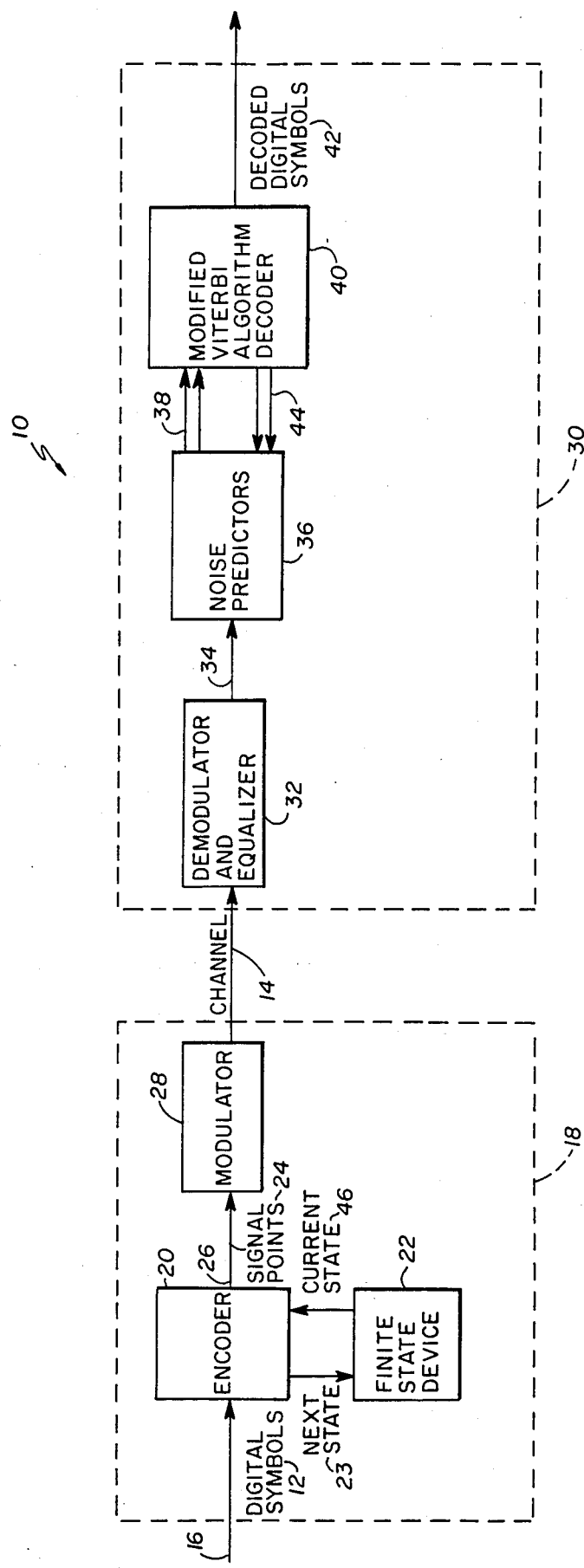
FIG. 2 is a block diagram of a coded modulated carrier communication system.

Referring to FIG. 2, in coded modulated carrier communication system 10, a stream of digital symbols 12 to be sent over a band-limited, noise-affected channel 14 (e.g., a telephone line) are delivered over line 16 to transmitter 18. In transmitter 18, an encoder 20 and an associated finite state device 22 encode the stream of data symbols 12 into a sequence of signal points 24 carried over line 26 to a modulator 28 which modulates a carrier in accordance with the signal points (e.g., by quadrature amplitude modulation QAM) for delivery to channel 14.

At the other end of channel 14, the noise affected modulated carrier is delivered to a receiver 30 where it is passed through a demodulator and equalizer 32. The complex valued, demodulated and equalized received signals, delivered over line 34, are then subjected to correction by noise predictors 36. Corrected modified versions of the received signals are delivered over lines 38 to a modified Viterbi algorithm decoder 40. Decoder 40 estimates which sequence of signal points 24 was likely to have been used for modulation at transmitter 18, and decodes that sequence into a stream of decoded digital symbols 42. Information about preliminary decisions made in decoder 40 is fed back as a number of feedback signals over lines 44 for use by noise predictors 36.

At transmitter 18, encoder 20 selects each successive signal point 24 based on the digital symbol 12 to be sent and on the current state 46 (from among a plurality of possible states, in this case two) then occupied by finite state device 22. After a signal point 24 is selected, the finite state device is updated to the next state 23 based on its prior state and on the particular signal point selected. Accordingly, over time, finite state device 22 occupies a sequence of states which represent dependencies between the successive signal points in the encoded sequence. Note that if the number of possible states is two, there are four different possible types of transitions between successive states which can occur in the finite state device 22 after a signal point is selected, namely transitions from state 0 to state 0, from state 0 to state 1, from state 1 to state 1, or from state 1 to state 0.

Figure 3:
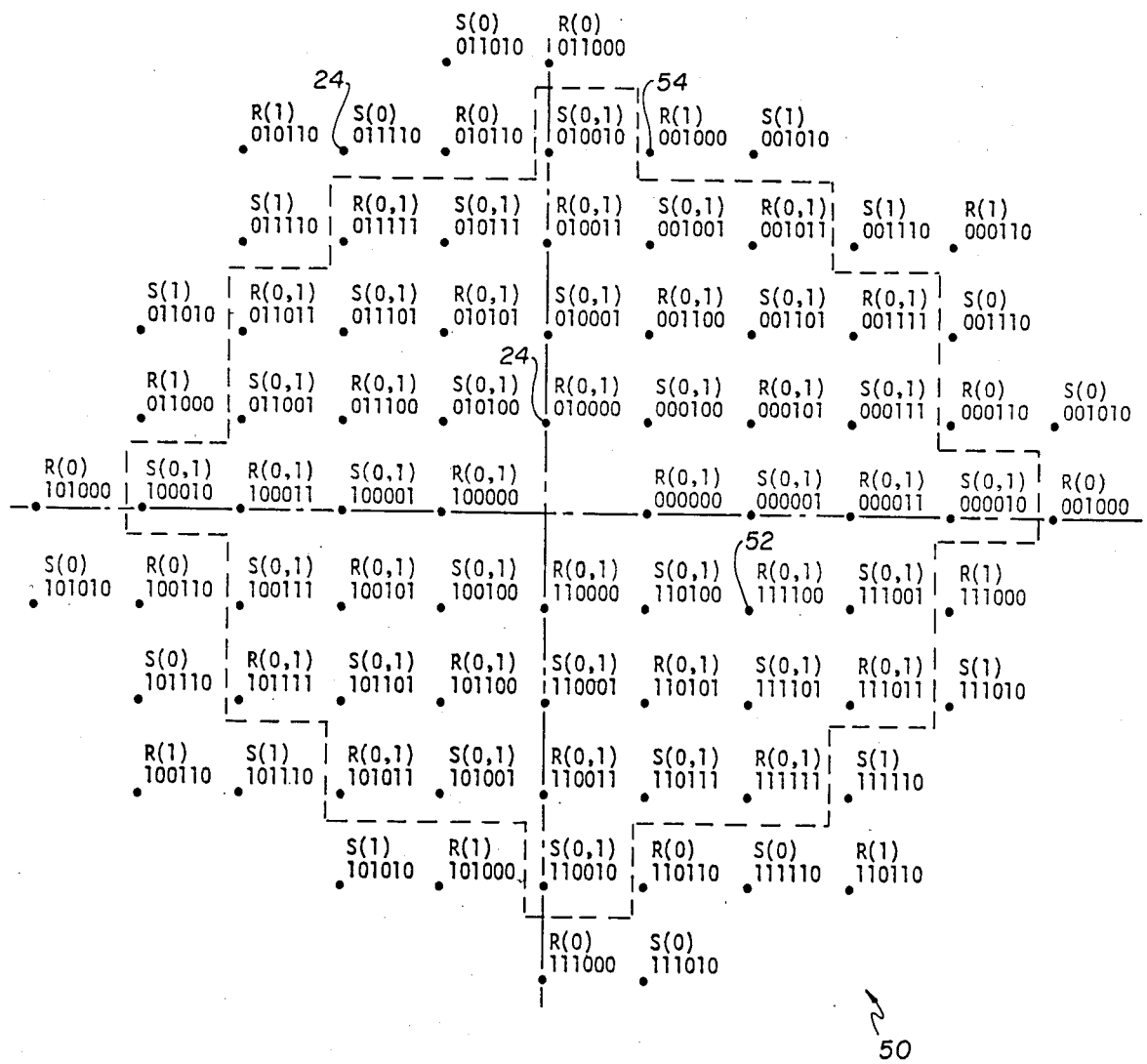
FIG. 3 is a constellation of signal points for use with the system of FIG. 2.

Referring to FIG. 3, the alphabet 50 from which the signal points 24 are drawn is a two dimensional constellation of 80 signal points 52 organized into four subsets denoted S(0), R(0), S(1), R(1). The 0 or 1 in the parentheses indicates the state which the finite state device 22 must occupy in order for such a signal point to be selected. Some signal points have both a 0 and a 1 within the parenthesis indicating that the finite state device 22 may occupy either state for such a signal point to be selected. The S or R indicates the state transition which is thereafter to be made by the finite state device 22. S indicates that the state is to remain the same, R that the state is to be reversed. The four subsets correspond respectively to the four different types of possible transitions of finite state device 22. For example, when finite state device 22 is in state 1, if signal point 54 (an R point) is selected, then the finite state device will reverse to state 0.

Each digital symbol 12 has 6 bits and the 64 possible digital symbols ar encoded into the 80 different signal points. Because there are more possible signal points than possible symbols, some symbols are encoded into one of two possible signal points using the state of the finite state device to determine which of the two possible signal points is to be selected.

Figure 4:
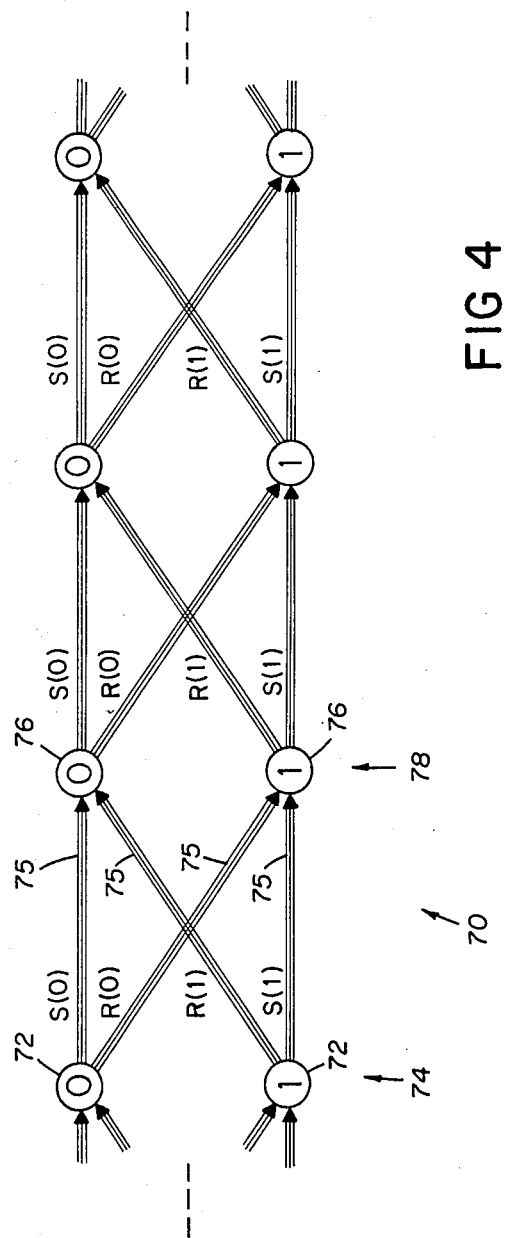
FIG. 4 is a trellis diagram corresponding to the system of FIG. 2.

Referring to FIG. 4, the sequence of states occupied by the finite state device in successive symbol intervals can be represented by a state transition diagram 70 (called a trellis). The two possible states in a first symbol interval (represented, e.g., by two circles 72 in a column 74) are each connected by state transition lines 75 (called trellis branches) to the two possible states in the next symbol interval (represented by two circles 76 in a column 78 to the right of column 74). The four branches 75 are respectively labeled S(0), R(0), S(1), R(1) to correspond to the four subsets of signal points of FIG. 3. For example, the branch S(0) represents all S(0) signal points, i.e., those which will result in a transition from state 0 to the same state 0.

A particular sequence of signal points delivered by encoder 20 corresponds to a unique path through trellis 70 made up of a succession of connecting branches 75. The path through the trellis represents the corresponding sequence of states and state transitions of the finite state device 22 (and hence the subsets to which the signal points in the sequence belong).

Trellis diagrams are more fully described in Forney, "The Viterbi Algorithm", Proc. IEEE, 61(3):268, March, 1973, incorporated herein by reference. The signal point alphabet 50 of FIG. 3 and the trellis 70 of FIG. 4 are more fully explained in Forney, U.S. patent application Ser. No. 439,740, filed Nov. 8, 1982, and assigned to the same assignee as this application, incorporated by reference.

In effect, the sequence of signal points sent from encoder 26 carries with it information (in the form of the identifies of the subsets from which those signal points were drawn) about the encoder's path through the trellis.

In general, in decoder 40 the decoding process involves first determining which path through the trellis is most likely to have been the one followed by finite state device 22. Once that maximum likelihood path is found, the sequence of signal point subsets corresponding to that path (called the maximum likelihood path history) is used together with the sequence of received signals to decide which signal points were sent from amon the signal points contained in the respective subsets representing the maximum likelihood path history.

As of any particular symbol interval in time, e.g., the kth interval, there are theoretically an infinite number of trellis paths ending in the two possible states occupied by the finite state device. The receiver's task is to find the best of those paths, namely the one nearest to the sequence of received signals. The Viterbi algorithm is a way to find the best path without keeping track of the signal points which lie along every one of the paths (called the path histories) and without having to evaluate the distance between every path and the sequence of received signals (called the path metrics). Instead, at each interval, the receiver only. stores one best surviving path history ending in each one of the possible states. Then it extends those surviving path histories by one more interval based on calculations of the permissible branch metrics leading from the states in the prior (k−1) interval to the states in the present (k) interval. Thus, at any time the receiver need only store as many surviving path histories as there are possible states.

Figure 5:
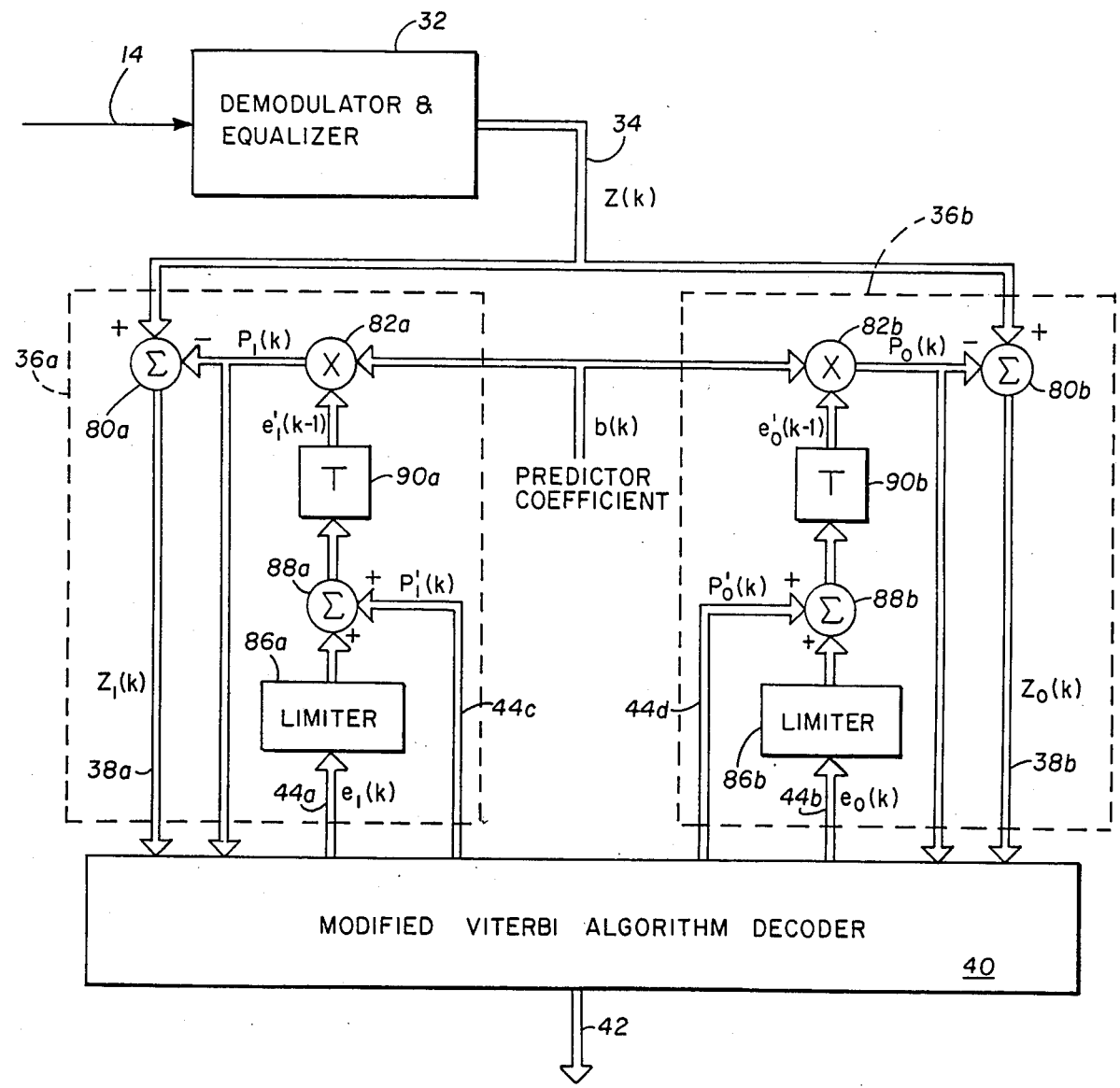
FIG. 5 is a block diagram of the noise predictors of FIG. 2.

Referring to FIG. 5, in receiver 30 (FIG. 2) there are two noise predictors 36a, 36b (one for each of the two possible states of the finite state device 22). Both predictors 36a, 36b receive as inputs the same demodulated and received signals over line 34, but the two predictors produce different modified versions, $z_1(k)$ and $z_0(k)$, of the received signals respectively over lines 38a, 38b for delivery to decoder 40.

Referring first to predictor 36a in the kth symbol interval, a subtracter 80a takes the received signal z(k) and subtracts a value $p_1(k)$ representing a prediction of the noise component of signal z(k) based on the assumption that finite state device 22 was in state 1 for the (k−1) symbol interval. The resulting modified symbol $z_1(k)$ is delivered over line 38a to decoder 40. The noise prediction value $p_1(k)$ is obtained by multiplying (in multiplier 82a) a signal representing an estimate $e_1'(k-1)$ of the noise component in the previous received signal z(k−1) by a predictor coefficient for the kth interval, b(k). The estimate $e_1'(k-1)$ is obtained as follows. In the (k−1) interval an error signal $e_1(k-1)$ representing the error between $z_1(k-1)$ or $z_0(k-1)$ (depending on whether 0 or 1 was the state in interval k−2 which is on the surviving trellis path leading to state 1 in the k−1 interval) and the most recent symbol in that surviving path history leading to state 1 in the (K−1) interval is fed back over line 44a from decoder 40 to limiter 86a. Also a prediction signal $p_1'(k-1)$ representing the predictor output used with respect to the most recent transition on that surviving path is fed back over line 44c to summer 88a where it is added to the output of limiter 86a. That sum is then delayed by one symbol interval in delay 90a for use in the kth symbol interval.

Likewise, in predictor 36b, subtracter 80b takes received signal z(k) and subtracts $p_0(k)$ representing a prediction of the noise component of signal z(k) based on the assumption that the finite state device is in state 0 for symbol interval k−1. The resulting modified signal $z_0(k)$ is delivered over line 38b to decoder 40. The noise prediction value $p_0(k)$ is obtained in a similar manner to $p_1(k)$ using multiplier 82b, limiter 86b, summer 88b and delay 90b. The same predictor coefficient is used for both predictors.

Thus, the following relationships exist:

$p_0(k) = b(k) \, e_0'(k-1);$ $p_1(k) = b(k) \, e_1'(k-1);$ $z_0(k) = z(k) - p_0(k);$ $z_1(k) = z(k) - p_1(k).$

The maximum likelihood path is determined by finding which permissible sequence of signal point subsets (i.e., which trellis path) is closest (measured in aggregate squared distance) to the sequence of received signals. The distance (called a branch metric) between a received signal and a signal point from a subset corresponding to a given branch of the trellis is the squared distance between them. The distance (called a path metric) between a received signal sequence and a sequence of signal points from subsets corresponding to a trellis path is the arithmetic sum of the squared distances between each of the received signals in the sequence and the corresponding signal points along the path.

The decoding process steps are repeated in each symbol interval. Because the decoding depends on analysis of a sequence of received signals, the "final" decision of which signal point was sent in a particular interval must be delayed for a number (e.g., 16) of symbol intervals until the probability of error in estimating the most likely trellis path is acceptably small.

Nevertheless, preliminary decisions—although subject to a greater probability of error—can also be made. For example, it is possible to make two alternative preliminary decisions of which signal points lie on the surviving paths leading to the two possible states in the k−1 interval. In the preferred embodiment, such preliminary decisions form the basis of the error values $e_1(k-1)$, $e_0(k-1)$ which are fed back over lines 44a, 44b to predictors 36a, 36b to aid in the formation of the modified received signals $z_1(k)$ and $z_0(k)$, thus improving the performance of the decoding in the face of noise. Decoding proceeds as follows.

For the kth symbol interval, the first decoding step is to find the one signal point in each subset which is closest to the relevant one of the two modified received signals. Specifically, decoder 40 first locates the closest signal points in the subsets S(0) and R(0), respectively, to the modified received signal $z_0(k)$, and the closest points in the subsets S(1) and R(1), respectively, to the modified received signal $z_1(k)$. This is done by passing each modified received signal through a slicer which performs two conventional slicing operations on the signal point alphabet in each of two dimensions in the vicinity of the relevant modified received signal. This step alone reduces from 80 to 4 the number of contending signal points.

Next, the squared distance (called the branch metric) between each relevant modified received signal and each of the four contending signal points is computed. These squared distances are denoted $d^2(00)$, $d^2(01)$, $d^2(10)$, $d^2(11)$ where the value in parentheses indicates the signal point subset, i.e., 00=S(0), 01=R(0), 10=R(1), and 11=S(1). For example, the value $d^2(00)$ is the squared distance between the modified received signal $z_0(k)$ and the contending signal point in the S(0) subset. More specifically, $d_{00}^2(k) = |s_0(k) - z_0(k)|^2$ $d_{01}^2(k) = |r_0(k) - z_0(k)|^2$ $d_{10}^2(k) = |r_1(k) - z_1(k)|^2$ $d_{11}^2(k) = |s_1(k) - z_1(k)|^2$ The next step is to take the branch metric leading to each of the two possible kth-interval states and add it to a so called normalized surviving metric of the previous (k−1) state (determined in the manner described below) to obtain a so called contending metric.

To do this decoder 40 first assumes that state 0 is the correct kth interval state. It then compares the sum of the surviving metric for the 0 state in the k−1 interval (called $m_0(k-1)$) plus the branch metric corresponding to the subset S(0) branch, $m_0(k-1) + d_{00}^2(k)$, with the sum of the surviving metric for state 1 in the k−1 interval plus the branch metric corresponding to the subset R(0) branch, $m_1(k-1) + d_{10}^2(k)$. The smaller of the two sums—which represents the minimum path metric assuming the kth state is 0—is saved as $m_0'(k)$.

If the first sum—$m_0(k-1) + d_{00}^2(k)$—is smaller, then based on the assumption that the kth state is 0, it can be inferred that the k−1 state was 0. In this event, the error $e_0(k)$ corresponding to that branch is the difference between the modified received signal $z_0(k)$ and the nearest S(0) signal point, $e_0(k)=z_0(k)-s_0(k)$. The value $e_0(k)$ is fed back over line 44b. The corresponding predictor output $p_0'(k)=p_0(k)$ is fed back over line 44d. The value $\hat{e}_0(k-1)=e_0'(k-1)$ is saved for possible use in updating the predictor coefficient. Note that $s_0(k)$, the nearest S(0) signal point to the modified received signal $z_0(k)$ represents the preliminary decision of which signal point was sent in the kth interval, assuming that the correct state in the kth interval is 0.

The kth signal point in the maximum likelihood path history then becomes the signal point corresponding to state 0 in the kth interval, i.e., $h_0'(k)=S_0(k)$, and the maximum likelihood path history leading to state 0 in the k−1 interval is saved as the new maximum likelihood path history:

$$h_o'(k-1) = h_o(k-1),$$

$$\ldots,$$

$$h_o'(k-L-1) = h_o(k-L-1),$$

where L is the number of the symbol intervals before a final decision is made.

If, on the other hand, the second sum—$m_1(k-1)+d_{10}^2(k)$—is smaller, then based on the assumption that the kth state is 0 it can be inferred that the (k−1) state was 1. In this event, the error $e_0(k)$ is the difference between the modified received signal $z_1(k)$ and the nearest R(1) signal point, i.e., $e_0(k)=z_1(k)-r_1(k)$.

The corresponding predictor output is $p_0'(k)=p_1(k)$, because the surviving transition leading to state 0 came from state 1. The value $p_0'(k)$ is fed back over line 44d. The value $e_0(k-1)=e_1'(k-1)$ is saved for possible use in updating the predictor coefficient. The kth signal point in the maximum likelihood path history becomes the signal point corresponding to the transition 1 to 0, $h_0'(k)=r_1(k)$, and the remaining path history is taken as being the path history leading to state 1 in the k−1 interval:

$$h_o'(k-1) = h_1(k-1),$$

$$\ldots,$$

$$h_o'(k-L-1) = h_1(k-L-1).$$

Thus, $h_0'(k-1)$ represents one alternative preliminary decision of the signal point sent in interval k−1 assuming that state 0 is the correct state in the kth interval.

Next the same procedure is followed based on the assumption that the kth state is state 1. The sum of the surviving metric for state 1 in the k−1 interval (called $m_1(k-1)$) plus the branch metric corresponding to the subset S(1) branch, $m_1(k-1)+d_{11}^2(k)$, is compared with the sum of the surviving metric for state 0 in the k−1 interval plus the branch metric corresponding to the subset R(1) branch, $m_0'(k-1)+d_{01}^2(k)$. The smaller of the two sums, which represents the minimum path metric assuming the kth state is 1, is saved as $m_1'(k)$.

If the first sum—$m_1(k-)+d_{11}^2(k)$—is smaller, then based on the assumption that the kth state is 1, it can be inferred that the k−1 state was 1. In this event the error $e_1(k)$ is the difference between the modified received signal $z_1(k)$ and the nearest S(1) signal point, i.e., $e_1(k)=z_1(k)-s_1(k)$. The value $e_1(k)$ is fed back over line 44a. The corresponding predictor output, $p_1'(k)=p_1(k)$, is fed back. The value $e_1(k-1)=e_1'(k-1)$ is saved for possible use in updating the predictor coefficient. The kth signal point in the maximum likelihood path history becomes the signal point corresponding to state 1 in the kth interval, i.e., $h_1'(k)=s_1(k)$, and the remaining maximum likelihood path history is taken as the maximum likelihood path history leading to state 1 in the k−1 interval:

$$h_1'(k-1) = h_1(k-1),$$

$$\ldots,$$

$$h_1'(k-L-1) = h_1(k-L-1).$$

If, on the other hand, the second sum—$m_0(k-1)+d_{01}^2(k)$—is smaller, then based on the assumption that the kth state is 1 it can be inferred that the k−1 state was 0. In this event, the error $e_1(k)$ is the difference between the modified received signal $z_1(k)$ and the nearest R(0) signal point, i.e., $e_1(k)=z_1(k)-r_0(k)$. The value $e_1(k)$ is fed back over line 44a. The corresponding predictor output is $p_1'(k)=p_0(k)$. The value $e_1(k-1)= e_0'(k-)$ is saved for possible use in updating the predictor coefficient. The kth signal point in the maximum likelihood path history becomes the signal point corresponding to state 0 in the kth interval, i.e., $h_1'(k)=r_0(k)$, and the remaining maximum likelihood path history is taken as the maximum likelihood path history leading to state 0 in the k−1 interval:

$$h_1'(k-1) = h_0(k-1),$$

$$\ldots,$$

$$h_1'(k-L-1) = h_0(k-L-1).$$

Thus, $h_1'(k-1)$ represents an alternative preliminary decision of which signal point was sent in interval (k−1) assuming that state 1 is the correct state for interval (k).

The updated path histories corresponding to the most likely 1−1 state leading to each of the two assumed k states are then saved as the surviving path histories:

$$h_o(k) = h_o'(k),$$

$$h_o(k-1) = h_o'(k-1),$$

$$\ldots,$$

$$h_o(k-L-1) = h_o'(k-L-1);$$

and $$h_1(k) = h_1'(k),$$

$$h_1(k-1) = h_1'(k-1),$$

$$\ldots,$$

$$h_1(k-L-1) = h_1'(k-L-1).$$

To determine which of the assumed kth states is the more likely, the smallest metrics leading to each assumed kth state, $m_0'(k)$ and $m_1'(k)$, are compared, and the smaller quantity is saved as $m_{min}$. If $m_0'(k)$ is smaller, then the kth state is taken as being state 0 and the final delayed decision is taken from the maximum likelihood path leading to state 0 in the kth interval, i.e., is $h_0k-L-1$). If $m_1'(k)$ is smaller, then the kth state is taken as being state 1 and the final delayed decision is taken from the maximum likelihood path history leading to state 1 in the kth interval, i.e., is $h_1(k-L-1)$.

The final surviving metrics are then adjusted to prevent growth without bound by normalizing to 0:

$$m_0(k) = m_0'(k) - m_{min};$$

$$m_1(k) = m_1'(k) - m_{min}.$$

The predictor coefficient b(k) is then updated according to which of the two assumed kth states is more likely. If $m_0'(k)$ is less than $m_1'(k)$, indicating that state 0 is the more likely kth state, then $$b(k+1) = b(k) + ae_0(k)e_0^*(k-1).$$

If $m_1'(k)$ is less than $m_0(k)$, then state 1 is the more likely current state and $$b(k+1) = b(k) + ae_1(k)e_1^*(k-1).$$

(where * denotes the complex conjugate).

Note that "a" is a positive real adaptation constant. Error signals used for prediction during the next (k+1) symbol interval can then be computed according to:

$$e_0'(k+1) = p_0'(k) + lim[e_0(k)]$$

$$e_1'(k+1) = p_1'(k) + lim[e_1(k)].$$

These error signals are representative of the error in the received signal z(k) prior to prediction, with respect to the tentative decisions leading to state 0 and 1, respectively. The lim [e]function limits the magnitude of the real and imaginary parts of the complex quantity e to a predetermined limit value, thus reducing the chances of propagation of decision errors. This predictive form of the decision-feedback equalizer thus allows control over error propagation.

Figure 6:
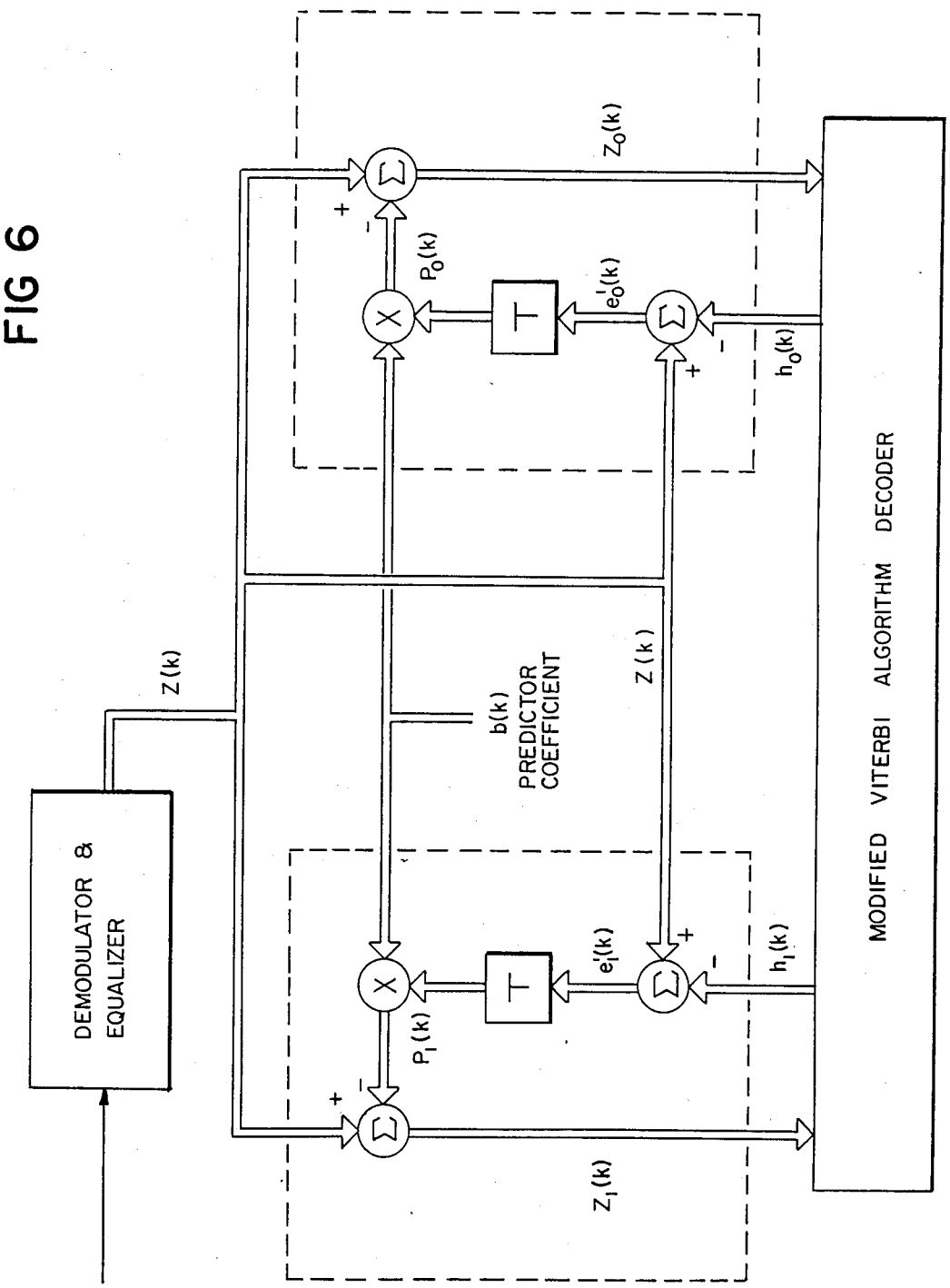

If limiting the error function was not necessary, then an alternative form of the predictor, shown in FIG. 6, could be used. Here the error signal $e_0'(k)$ is obtained by subtracting the preliminary decision for state 0, i.e. $h_0(k)$, from the demodulated equalized signal z(k). Similarly, the error signal for the state 1 predictor is given by $e_1'(k) = z(k) - h_1(k)$.

The noise predictors and modified Viterbi algorithm decoder can be implemented by a microprocessor programmed to perform the steps described above.

The invention provides the advantages of feedback techniques to improve noise immunity in systems which delay the final receiver decisions, error propagation which would result if error prone tentative decisions were used in a single feedback device is avoided, and the correlation which exists between successive error signals before prediction can be removed. Since the best preliminary decisions in each surviving path are used to predict and compensate for noise at each interval, the trellis path which is ultimately selected as the most likely will always have been derived using those best preliminary decisions. For channel characteristics with attenuation distortion, a signal-to-noise ratio advantage of 0.5 to 1.5 dB can be obtained by using a noise predictor with even a single coefficient, the actual advantage depending on the channel characteristics and the coding system employed.

Other embodiments are within the following claims.

Referring to FIG. 7, in a baseband communication system 102, a stream of binary digits are translated in encoder 104 into ±1 volt pulses at the signaling rate and filtered in transmit filter 106 to generate an analog signal to be sent over a band-limited, noise-affected channel 108.

At the other end, the noise-affected signal is passed through a receive filter 110 and a feed-forward section of a decision-feedback equalizer 112 to generate a seguence of received signals at the signaling rate. The received signals are then subjected to correction by feedback equalizers 114, with the objective of limiting the impulse response of the equalized system to two terms, with values $f_0$ and $f_1$, selected by known methods. Feedback equalized versions of the received signals are delivered to a modified Viterbi algorithm detector 116, which estimates which sequence of pulses was likely to have been transmitted. Information about preliminary decisions made in the detector is fed back for use by the feedback equalizers.

Referring to FIG. 8, a finite-state model 120 of the equalized channel is represented by a transversal filter with coefficients $f_0$ and $f_1$. Each time a new pulse is sent, the channel state is updated to a new value +1 or -1 according to the contents of the memory unit 122 in FIG. 8. These two states can be denoted as 0 and 1, respectively. Four different possible transitions between successive states can occur in this finite state model with four corresponding outputs as listed below and illustrated in FIG. 9 as a trellis diagram.

| Transition | Output |
| --- | --- |
| State 0 to State 0: | $f_0 + f_1$ |
| State 0 to State 1: | $-f_0 + f_1$ |
| State 1 to State 0: | $f_0 - f_1$ |
| State 1 to State 1: | $-f_0 - f_1$ |

Referring to FIG. 10, the Viterbi detector 116 determines which path through the trellis is most likely to have been the one followed by the finite-state model based on the received equalized signals. In FIG. 10, there are two feedback equalizers 120, 122, one for each of th two possible states of the finite-state model. Both feedback equalizers receive the same received signals z(k) but produce different modified versions $z_0(k)$ and $z_1(k)$ for delivery to the detector.

In the kth signaling interval, $$z_0(k) = z(k) + \sum_{n=2}^{N+1} b_n(k)h_0(k-n),$$

and $$z_1(k) = z(k) + \sum_{n=2}^{N+1} b_n(k)h_1(k-n),$$

where $b_n(k)$, n=2, 3 ..., N+1, are the N feedback equalizer coefficients at time k, $h_0(k)$ is the path history of preliminary decisions leading to state 0, and $h_1(k)$ is the path history leading to state 1.

Detection proceeds as follows. First, the squared distance between each relevant modified received signal and each of the four outputs corresponding to contending transitions is computed. Specifically, $$d_{00}^2(k) = (f_0 + f_1 - z_0(k))^2,$$

$$d_{01}^2(k) = (-f_0 + f_1 - z_0(k))^2,$$

$d_{10}^2(k) = (f_0 - f_1 - z_1(k))^2$, $d_{11}^2(k) = (-f_0 - f_1 - z_1(k))^2$,

The next step is to add the branch metrics to the appropriate surviving metrics to obtain so called contending metrics.

Assuming that state 0 is the correct kth interval state, compare $m_0(k-1) + d_{00}^2(k)$ to $m_1(k-1) + d_{10}^2(k)$.

If the former is smaller, save the metric $m_0' = m_0(k-1) + d_{00}^2(k)$, the error $e_0(k) = f_0 + f_1 - z_0(k)$, and the path history $h_0'(k) = +1$, $h_0'(k-1) = h_0(k-1)$,

.

.

.

$h_0'(k-L-1) = h_0(k-L-1)$.

Otherwise, save the metric $m_0'(K) = m_1(k-1) + d_{10}^2(k)$, the error $e_0(k) = f_0 - f_1 - z_1(k)$, and the path history $h_0'(k) = +1$, $h_0'(k-1) = h_1(k-1)$,

.

.

.

$h_0'(k-L-1) = h_1(k-L-1)$.

Similarly, assuming that state 1 is the correct kth interval state, compare $m_1(k-1) + d_{11}^2(k)$ to $m_0(k-1) + d_{02}^2(k)$.

If the former is smaller, save the metric $m_1'(k) = m_1(k-1) + d_{11}^2(k)$, the error $e_1(k) = -f_0 - f_1 - z_1(k)$, and the path history $h_1'(k) = -1$, $h_1'(k-1) = h_1(k-1)$,

.

.

.

$h_1'(k-L-1) = h_1(k-L-1)$.

Otherwise, save the metric $m_1'(k) = m_0(k-1) + d_{01}^2(k)$, the error $e_1(k) = -f_0 + f_1 - z_0(k)$, and the path history $h_1'(k) = -1$ $h_1'(k-1) = h_0(k-1)$

.

.

.

$h_1'(k-L-1) = h_0(k-L-1)$

The updated path histories corresponding to the most likely paths terminating in states 0 and 1 at time k are then saved as the surviving path histories:

$h_0(k) = h_0'(k)$, $h_0(k-1) = h_0'(k-1)$,

.

.

.

$h_0(k-L-1) = h_0'(k-L-1)$;

and $h_1(k) = h_1'(k)$, $h_1(k-1) = h_1'(k-1)$,

.

.

.

$h_1(k-L-1) = h_1'(k-L-1)$;

To determine which of the assumed kth states is the more likely, the smallest metrics leading to each assumed kth state, $m_0'(k)$ and $m_1'(k)$, are compared, and the smaller quantity is saved as $m_{min}$. If $m_0'(k)$ is smaller, then the kth state is taken as being state 0 and the final delayed decision is taken from the maximum likelihood path leading to state 0 in the kth interval, i.e., is $h_0(k-L-1)$. If $m_1'(k)$ is smaller, then the kth state is taken as being state 1 and the final delayed decision is taken from the maximum likelihood path history leading to state 1 in the kth interval, i.e., is $h_1(k-L-1)$.

The final surviving metrics are then adjusted to prevent growth without bound by normalizing to 0:

$m_0(k) = m_0'(k) - m_{min}$;

$m_1(k) = m_1'(k) - m_{min}$.

The feedback equalizer coefficients $b_n(k)$ are then updated according to which of the two assumed kth states is more likely. If $m_0'(k)$ is less than $m_1 40$ (k), indicating that state 0 is the more likely kth state, then $b_n(k+1) = b_n(k) - a\ e_0(k)h_0(k-n)$, $n = 2, \ldots, N+1$.

If $m_1'(k)$ is less than $m_0'(k)$, then state 1 is the more likely current state and $$b(k+1)=b(k)-a\ e_1(k)h_1(k-n),\ n=2,\ldots,N+1.$$

(Note that $h_0$ and $h_1$ the latest surviving path histories).

Note that "a" is a positive real adaptation constant. The forward equalizer coefficients are updated to minimize the final mean squared error.

In the first embodiment, the noise predictors can be expanded to employ multiple prediction coefficients. In that case, the predictor associated with each state includes a delay line which stores a history of values representative of the error values for the branches of the surviving trellis path terminating in that state. The new delay line history for the state 0 predictor is then an extension of the state 0 or state 1 predictor delay line history depending on whether the new surviving path leading to state 0 is a descendent of the previous state 0 or previous state 1 surviving path. The state 1 predictor delay line history is updated in a similar way.

The same invention can be applied to adaptive phase prediction by using a number of parallel adaptive phase predictors each corresponding to one state of the finite state device. Furthermore, both noise prediction and adaptive phase prediction can be combined using both parallel adaptive phase preditors and parallel noise predictors. Other coding structures can be used including those having more than 2 states as well as multidimensional structures and block codes. The coefficient updating can be delayed and be based on final decisions.

I claim:

1. A communication system comprising a transmitter, and a receiver for use in deciding which signal points were sent from said transmitter based on corresponding noise affected signals received over a channel, said transmitter comprising an encoder for encoding a stream of information symbols into said signal points, said noise affected signals carrying information about a particular sequence of possible states occupied in a succession of time intervals by a finite state means, said receiver comprising feedback circuitry for generating a plurality of different modified versions of each said received signal, and a decoder for deciding which signal points were sent based on estimating said particular sequence of states by using at least two different said modified versions, said decoder storing a plurality of surviving sequences of states each ending in a current state, said feedback circuitry being connected to receive feedback information from said decoder, each said modified version being based on at least some states that are earlier in said surviving sequences than said current states.

2. The system of claim 1 wherein said decoder estimates said particular sequence of states based on estimating the most likely possible surviving sequences of prior said states ending in different ones of said possible states in a first time interval, and based on extending said surviving sequence for each said state in said first time interval to said possible states in a next time interval by means of calculations with respect to state transitions leading to each of said possible states in the next time interval, and said decoder bases at least one of said state transition calculations on one of said modified versions, and at least a second one of said state transition calculations on a different one of said modified versions.

3. The receiver of claim 1 wherein said decoder generates a plurality of different feedback signals for said feedback circuitry, and said feedback circuitry generates said different modified versions of said received signals based respectively on different said feedback signals.

4. The receiver of claim 3 wherein
said decoder generates final decisions about which signal point was sent from said transmitter after a plurality of said time intervals have passed, and generates alternative preliminary decisions about which signal point was sent after fewer said time intervals have passed, said different feedback signals being based on said alternative preliminary decisions.

5. The receiver of claim 1 wherein said decoder estimates said particular sequence of states based on estimating the most likely possible surviving sequences of prior said states ending in different ones of said possible states and said feedback circuitry generates different said modified versions corresponding to different said surviving sequences.

6. The receiver of claim 1 wherein said feedback circuitry comprises a plurality of decision feedback equalizers of the noise predictor type, and each said decision feedback equalizer generates one of said modified versions by offsetting said received signal by a noise prediction value.

7. The receiver of claim 6 wherein said decoder generates final decisions about which signal point was sent after a plurality of said time intervals has passed, and generates preliminary decisions about which signal point was sent after fewer said time intervals have passed, and said feedback circuitry generates said noise prediction values based on errors between modified versions of prior received signals and said preliminary decisions.

8. The receiver of claim 5 wherein there are two possible states in each said time interval, and two said modified versions of each said received signal, each said modified version being associated with one said surviving sequence.

9. The receiver of claim 2 wherein said decoder makes said state transition calculations by finding the distance between each said modified version and the nearest signal point associated with each of the state transitions in said surviving sequences leading to a state corresponding to said modified version, and said decoder returns to said feedback circuitry, feedback signals comprising the errors between each said modified version in a sequence of modified versions and the nearest signal points associated with each said surviving sequence of state transitions leading to the state corresponding to said modified version.

10. The receiver of claim 2 wherein said decoder makes said state transition calculations by finding the distance between each said modified version and the nearest signal point associated with each of the state transitions in said surviving sequences leading to a state corresponding to said modified version, and said decoder returns to said feedback circuitry the nearest signal points associated with each said surviving sequence of state transitions leading to the state corresponding to each said modified version.

11. The receiver of claim 7 wherein each said noise predictor comprises a limiter for limiting a weight of said errors on currently used noise prediction values.

12. The receiver of claim 1 wherein on said signal point is sent over the channel in each said time interval.

13. The receiver of claim 1 wherein said finite state process comprises a finite state device in said transmitter which occupies said particular sequence of states based on said information symbols.

14. The receiver of claim 1 wherein said feedback circuitry comprises a plurality of feedback equalizers each generating one of said modified versions.

15. The receiver of claim 1 wherein said transmitter further comprises a modulator for modulating a carrier in accordance with said signal points for transmission over said channel, and said receiver further comprises a demodulator for deriving said noise affected received signal from said modulated carrier.

* * * * *

UNITED STATES PATENT AND TRADEMARK OFFICE
CERTIFICATE OF CORRECTION

PATENT NO.  :  4,631,735

DATED       :  December 23, 1986

INVENTOR(S) :  Shahid U.H. Qureshi

It is certified that error appears in the above-identified patent and that said Letters Patent is hereby corrected as shown below:

Col. 1, line 46, "so called" should be --so-called--.

Col. 2, line 36, "Maximum Likelihood" should be --Maximum-Likelihood--.

Col. 2, line 43, "finite state" should be --finite-state--.

Col. 2, line 44, "finite state" should be --finite-state--.

Col. 2, line 47, "finite state" should be --finite-state--.

Col. 2, line 56, "Time Dispersive" should be --Time-Dispersive--.

Col. 3, line 8, "Decision Feedback" should be --Decision-Feedback--.

Col. 3, line 12, "Decision Feedback" should be --Decision-Feedback--.

Col. 3, line 26, after "these" insert --preliminary--.

Col. 4, line 42, "signal to noise" should be --signal-to-noise--.

UNITED STATES PATENT AND TRADEMARK OFFICE
CERTIFICATE OF CORRECTION

PATENT NO. : 4,631,735

DATED : December 23, 1986

INVENTOR(S) : Shahid U.H. Qureshi

It is certified that error appears in the above-identified patent and that said Letters Patent is hereby corrected as shown below:

Col. 4, line 67, insert the following:

--Fig. 6 is a block diagram of an alternate embodiment to Fig. 5.--.

Col. 5, line 16, "modulation QAM" should be --modulation--QAM--.

Col. 5, line 18, "noise affected" should be --noise-affected--.

Col. 5, line 21, "complex valued" should be --complex-valued--.

Col. 5, line 50, "two dimensional" should be --two-dimensional--.

Col. 5, line 68, "ar" should be --are--.

Col. 6, line 48, "amon" should be --among--.

Col. 8, line 52, "so called" should be --so-called--.

Col. 8, line 57, "kth interval" should be --kth-interval--.

Col. 9, line 35, "$e_0(k-1)=e_1'(k-1)$" should be --$\hat{e}_0(k-1)=e_1'(k-1)$--.

Col. 8, line 55, "so called" should be --so-called--.

UNITED STATES PATENT AND TRADEMARK OFFICE
CERTIFICATE OF CORRECTION

PATENT NO. : 4,631,735
DATED : December 23, 1986
INVENTOR(S) : Shahid U.H. Qureshi It is certified that error appears in the above-identified patent and that said Letters Patent is hereby corrected as shown below:

Col. 9, line 59, "$m_0'(k-1)+d_{01}^2(k)$" should be --$m_0(k-1)+d_{01}^2(k)$--.

Col. 9, line 62, "$m_1(k-)+d_{11}^2(k)$" should be --$m_1(k-1)+d_{11}^2(k)$--.

Col. 10, line 1, "$e_1(k-1)=e_1'(k-1)$" should be --$\hat{e}_1(k-1)=e_1'(k-1)$--.

Col. 10, line 23, "$e_1(k-1)=e_0'(k-)$" should be --$\hat{e}_1(k-1)=e_0'(k-1)$--

Col. 10, line 43, "likely 1-1" should be --likely L-1--.

Col. 11, line 1, "$h_0 k-L-1)$." should be --$h_0(k-L-1)$.--.

Col. 11, line 15, "$b(k+1)=b(k)+ae_0(k)e_0^*(k-1)$" should be --$b(k+1)=b(k)+ae_0(k)\hat{e}_0^*(k-1)$--.

Col. 11, line 20, "$b(k+1)=b(k)+ae_1(k)e_1^*(k-1)$" should be --$b(k+1)=b(k)+ae_1(k)\hat{e}_1^*(k-1)$--.

Col. 11, line 52, "techniques" should be --techniques--.

Col. 12, line 43, "th" should be --the--.

UNITED STATES PATENT AND TRADEMARK OFFICE
CERTIFICATE OF CORRECTION

PATENT NO. : 4,631,735
DATED : December 23, 1986
INVENTOR(S) : Shahid U.H. Qureshi It is certified that error appears in the above-identified patent and that said Letters Patent is hereby corrected as shown below:

Col. 13, line 2 "$d_{11}^2(k) - (-f_0 - f_1 - z_1(k))^2$" should be --$d_{11}^2(k) = (-f_0 - f_1 - z_1(k))^2$--.

Col. 13, line 6, "so called" should be --so-called--.

Col. 13, line 31, "$m_0'(K) = m_1(k-1) + d_{10}^2(k)$" should be --$m_0'(k) = m_1(k-1) + d_{10}^2(k)$--.

Col. 14, line 65, delete "40" after "$m_1$".

Col. 16, line 3, claim 3, replace "receiver" with --system--.

Col. 16, line 9, claim 4, replace "receiver" with --system--.

Col. 16, line 14, claim 4, after "sent" insert --from said transmitter--.

Col. 16, line 18, claim 5, replace "receiver" with --system--.

Col. 16, line 26, claim 6, replace "receiver" with --system--.

UNITED STATES PATENT AND TRADEMARK OFFICE
CERTIFICATE OF CORRECTION

PATENT NO.   :   4,631,735
DATED        :   December 23, 1986
INVENTOR(S)  :   Shahid U.H. Qureshi It is certified that error appears in the above-identified patent and that said Letters Patent is hereby corrected as shown below:

Col. 16, line 32, claim 7, replace "receiver" with --system--.

Col. 16, line 41, claim 8, replace "receiver" with --system--.

Col. 16, line 46, claim 9, replace "receiver" with --system--.

Col. 16, line 58, claim 10, replace "receiver" with --system--.

Col. 17, line 1, claim 11, replace "receiver" with --system--.

Col. 17, line 4, claim 12, replace "receiver" with --system--.

Col. 17, line 4, claim 12, "on" should be --one--.

Col. 17, line 6, claim 13, replace "receiver" with --system--.

Col. 18, line 1, claim 14, replace "receiver" with --system--.

Col. 18, line 4, claim 15, replace "receiver" with --system--.

Signed and Sealed this

Seventh Day of November, 1989

*Attest:*

JEFFREY M. SAMUELS

*Attesting Officer*    *Acting Commissioner of Patents and Trademarks*